United States Patent [19]
Jeon

[11] Patent Number: 5,849,618
[45] Date of Patent: Dec. 15, 1998

[54] METHOD FOR FABRICATING CAPACITOR OF SEMICONDUCTOR DEVICE

[75] Inventor: Yoo-Chan Jeon, Seoul-si, Rep. of Korea

[73] Assignee: LG Semicon Co., Ltd., Chungcheongbuk-Do, Rep. of Korea

[21] Appl. No.: 651,933

[22] Filed: May 21, 1996

[30] Foreign Application Priority Data

Jan. 10, 1996 [KR] Rep. of Korea ...................... 1996/371

[51] Int. Cl.⁶ .............................................. H01L 21/8242
[52] U.S. Cl. .......................................... 438/254; 438/397
[58] Field of Search .................................. 437/50, 52, 60, 437/919; 156/644.1; 438/3, 239, 240, 253–266, 396–399

[56] References Cited

U.S. PATENT DOCUMENTS 5,534,458   7/1996   Okudaira et al. ..................... 437/52

*Primary Examiner*—Jey Tsai
*Assistant Examiner*—Joni Y. Chang
*Attorney, Agent, or Firm*—Morgan, Lewis & Bockius LLP

[57] ABSTRACT

A method for fabricating a capacitor for a semiconductor device includes the steps of depositing an insulating layer on a substrate, selectively removing the insulating layer and forming a contact hole, forming a first electrode in the contact hole, removing the insulating layer to expose a portion of the first electrode, and sequentially forming a dielectric layer and a second electrode on the exposed portion of the first electrode.

19 Claims, 10 Drawing Sheets prior.art prior.art prior.art prior.art prior.art

METHOD FOR FABRICATING CAPACITOR OF SEMICONDUCTOR DEVICE

BACKGROUND OF THE INVENTION

1. Field of the Invention

The present invention relates to a method for fabricating a capacitor, and more particularly, to a method for fabricating a capacitor for a semiconductor device. While the capacitor of the present invention is suited for a variety of applications, it is particularly suited for semiconductor DRAMs.

2. Discussion of the Related Art

Generally, as the packing density of a semiconductor device increases, the area of a capacitor of the semiconductor device becomes reduced, resulting in a capacitance reduction. In order to compensate for the reduced capacitance, the capacitor dielectric layer becomes thinner. However, as the thickness of the dielectric layer decreases, the leakage current due to tunneling increases. As a result, the reliability of the semiconductor device deteriorates.

In order to keep the dielectric layer from becoming too thin while maintaining its capacitance, a widely used method forms a capacitor with a rough surface to thereby increase the effective area of the capacitor. Another method is to use a nitride oxide layer or reoxidized nitride oxide layer having a high dielectric constant as a dielectric layer for the capacitor. However, these methods produce steps or unevenness on the surface of a semiconductor device making it difficult to apply a photolithography process. This in turn increases the production cost. Accordingly, it is difficult to apply these methods to highly integrated devices such as 256M DRAMSs.

To increase the capacitance of a capacitor while reducing its surface roughness, one method is to use a material with a high dielectric constant as the dielectric layer for the capacitor. Accordingly, many studies concerning this technology have been performed. To date, the most widely studied material having a high dielectric constant is $Ta_2O_5$. A dielectric layer made of this material has several advantages such as thinning of the dielectric layer and improvement of the characteristics of the device. However, since the substantial dielectric constant of $Ta_2O_5$ is not very high, it will not be adequate for the new generations of highly integrated devices considering the trend of continual increase in packing density in the industry.

Recently, a perovskite-type oxide, such as a ferroelectric material, has become the center of studies as a dielectric to be used in semiconductor devices. The perovskite-type oxide includes $Pb(Zr,Ti)O_3(PZT)$, $(Pb,La)(Zr,Ti)O_3(PLZT)$, $(Ba,Sr)TiO_3(BST)$, $BaTiO_3$, and $SrTiO_3$. However, these materials easily react with silicon and silicide which form substrates. In addition, a strong oxidizing ambient is required during the formation of a thin film of those materials when oxidizing the electrode of the capacitor. Accordingly, studies to solve these fabrication-related problems have been carried out.

If a ferroelectric material, such as PZT or BST, is used as a dielectric layer for a capacitor, its thickness should be thicker than that of the widely used silicon oxide layer. This provides a capacitance five to ten times higher than that of a capacitor using a silicon oxide layer. Therefore, even though the electrode surface of the capacitor is not very rough or does not have many steps, a capacitance sufficient for storing information can be secured. When such a ferroelectric thin film is used as a dielectric layer of the memory device, an electrode having a simple stack structure or planar structure can also be used in fabricating the capacitor.

A conventional method for fabricating a capacitor for a semiconductor device will now be explained with reference to the accompanying drawings. FIGS. 1a to 1e are sectional views showing a conventional fabricating process or a capacitor. As shown in FIG. 1a, an interlevel insulating layer 2 is formed on a substrate 1 on which transistors (not shown) are formed. The interlevel insulating layer 2 is then selectively removed to expose the substrate 1 through photolithography, to thereby form a contact hole 3, as shown in FIG. 1b.

As shown in FIG. 1c, a material 4 for forming an electrode is deposited on the interlevel insulating layer 2 including the contact hole 3. Next, as shown in FIG. 1d, the material 4 is selectively removed to form a lower electrode 4A. As shown in FIG. 1e, a dielectric layer 5 is formed on the lower electrode 4A and the interlevel insulating layer 2. Then, an upper electrode 6 is formed on the dielectric layer 5.

However, the above-described conventional method has the following problems. A capacitor using ferroelectric material generally uses Pt as the material for the electrode. Pt is difficult to etch and usually causes problems when it is actually etched. For example, during a patterning process, a portion of the Pt electrode removed from the Pt layer is usually re-deposited on the side walls of a photoresist pattern, forming a sharp protrusion portion around the photoresist pattern. This protrusion portion is very thin and may be broken or removed during a successive processing procedure. Accordingly, this difference in photoresist pattern size results in a nonuniformity of capacitances among different capacitors.

If the protrusion portion is broken or damaged after the deposition of the dielectric layer, the upper and lower electrodes of the capacitor become short-circuited with each other. This may cause the whole memory device to operate incorrectly. Also, the portion of the protrusion that has been broken and removed may adhere to another portion of a wafer, making successive processes difficult. Since the protrusion portion is formed of the same material as that of the lower electrode (e.g., Pt), it is difficult to dry etch the protrusion portion. It often requires a process where a mechanical force is employed to remove the protrusion portion.

Another problem associated with the conventional method is that a separate patterning process, i.e., photolithography, is required in order to form the lower electrode of the capacitor. This increases the production cost.

SUMMARY OF THE INVENTION

Accordingly, the present invention is directed to a method for fabricating a capacitor for a semiconductor device that substantially obviates one or more of the problems due to limitations and disadvantages of the related art.

An object of the present invention is to provide a method for fabricating a capacitor for a semiconductor device with simplified fabrication process and increased capacitor area.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for fabricating a capacitor for a semiconductor device according to the present invention includes the steps of depositing an insulating layer on a substrate, selectively removing the insulating layer and forming a contact hole, forming a first electrode in the contact hole, removing the insulating layer to expose a portion of the first electrode, and sequentially forming a dielectric layer and a second electrode on the exposed portion of the first electrode.

In another aspect, a method for fabricating a capacitor for a semiconductor device according to the present invention includes the steps of depositing an insulating layer on a substrate, selectively removing the insulating layer and forming a contact hole having a recess region, forming a first electrode in the contact hole having the recess region, removing the insulating layer to expose a portion of the first electrode, and sequentially forming a dielectric layer and a second electrode on the exposed portion of the first electrode.

In a further aspect, a method for fabricating a capacitor for a semiconductor device according to the present invention includes the steps of depositing an insulating layer on a substrate, selectively removing the insulating layer and forming a contact hole, sequentially forming a first metal layer, a first diffusion stop layer, and a conductive semiconductor layer on the insulating layer and the contact hole, etching the conductive semiconductor layer, the first diffusion stop layer, and the first metal layer to expose the insulating layer and forming a first electrode, removing the insulating layer by a predetermined depth, sequentially forming a second diffusion stop layer and a second metal layer on the first electrode, and forming a dielectric layer and a second electrode on the first metal layer and the second metal layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
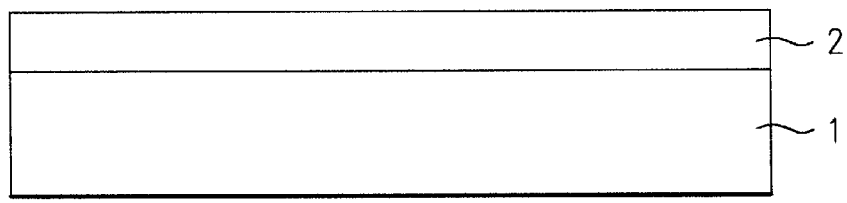
FIGS. 1a to 1e are cross-sectional views showing a conventional fabrication process of a capacitor for a semiconductor device.
Figure 1B:
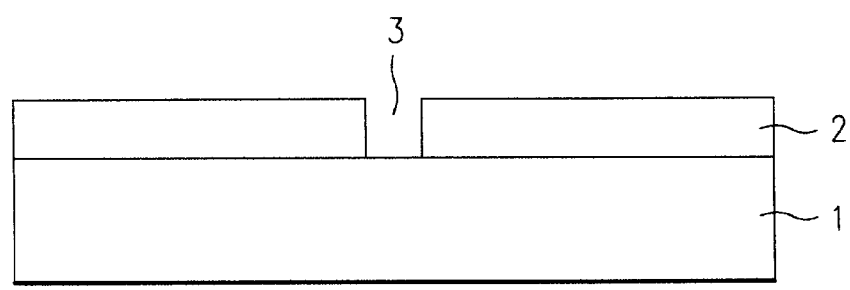
Figure 1C:
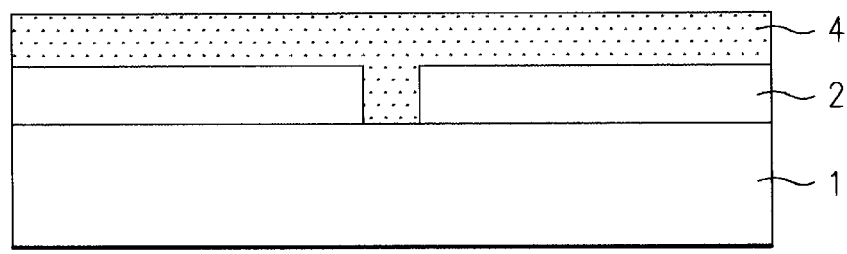
Figure 1D:
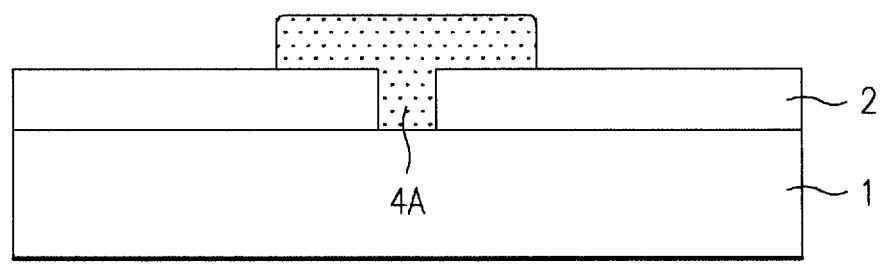
Figure 1E:
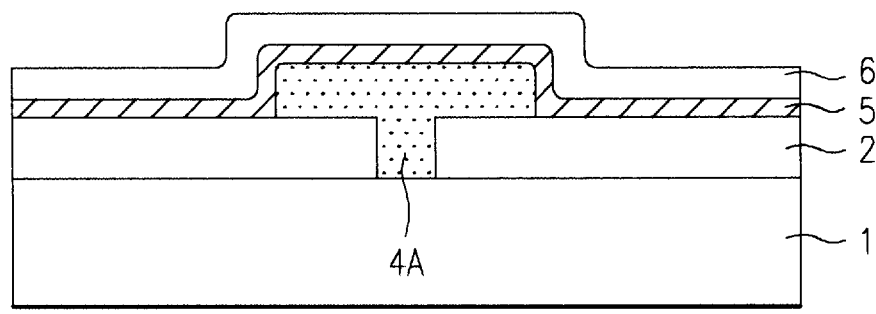
Figure 2A:
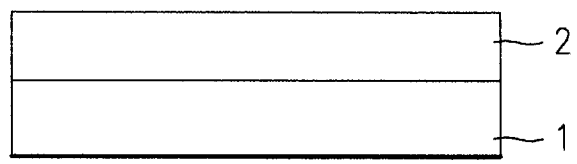
FIGS. 2a to 2f are cross-sectional views showing a fabrication process of a capacitor for a semiconductor device in accordance with a first embodiment of the present invention.

FIGS. 2a to 2f are cross-sectional views showing a fabrication process of a capacitor for a semiconductor device in accordance with a first embodiment of the present invention. As shown in FIG. 2a, an interlevel insulating layer 2 is formed on a substrate 1. Here, the interlevel insulating layer 2 is made thicker than a conventional interlevel insulating layer by a thickness of about 2000 Å, and is formed through a low pressure chemical vapor deposition (LPCVD) or atmospheric pressure chemical vapor deposition (APCVD) method.

Figure 2B:
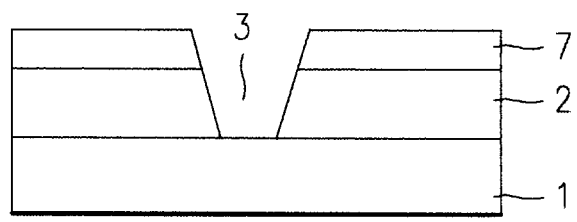

As shown in FIG. 2b, the interlevel insulating layer 2 is then selectively removed by using photolithography (with a resist pattern 7 as a mask) to expose the substrate 1, thereby forming a contact hole 3. Here, the contact hole 3 is anisotropically etched through reactive ion etching (RIE) so that the side walls of the contact hole 3 have a V-shape.

Figure 2C:
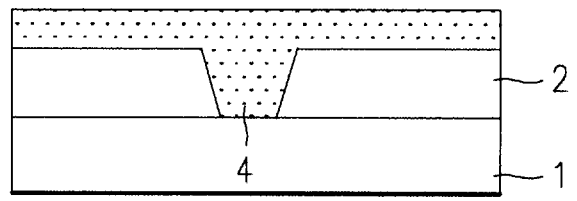
Figure 2D:
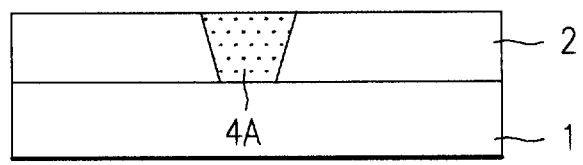

As shown in FIG. 2c, a material 4 for forming a lower electrode is deposited through LPCVD on the interlevel insulating layer 2 including the contact hole 3. Then, as shown in, FIG. 2d, the material 4 is etched back to expose the interlevel insulating layer 2, thereby forming a lower electrode 4A in the contact hole 3. The material 4 is etched back without a resist, by using a dry etch, a wet etch, or a chemical mechanical polishing.

Figure 2E:
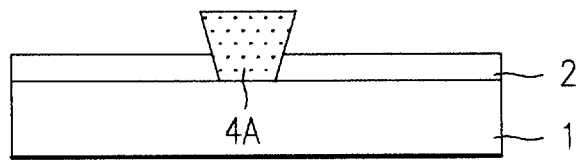
Figure 2F:
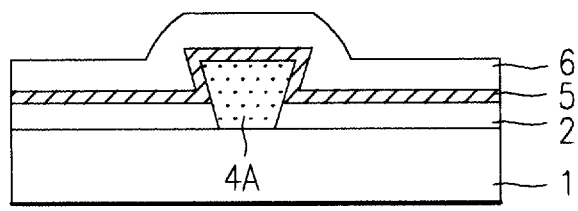

As shown in FIG. 2e, the interlevel insulating layer 2 is etched by about 2000 Å without using a resist, to expose a portion of the lower electrode 4A. As shown in FIG. 2f, a dielectric thin film 5 is formed on the overall surface of the interlevel insulating layer 2 and the lower electrode 4A. Then, an upper electrode 6 is formed on the dielectric thin film 5. The upper electrode 6 can be formed to have an area larger than that of the lower electrode 4A, since the lower electrode 4A has a size equal to the area of the contact hole.

Figure 3A:
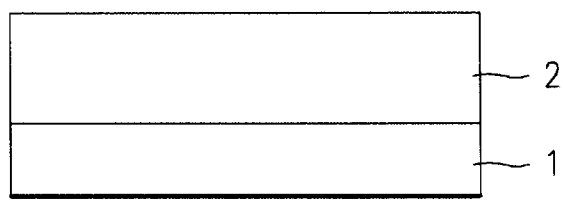
FIGS. 3a to 3f are cross-sectional views showing a fabrication process of a capacitor for a semiconductor device in accordance with a second embodiment of the present invention.
Figure 3B:
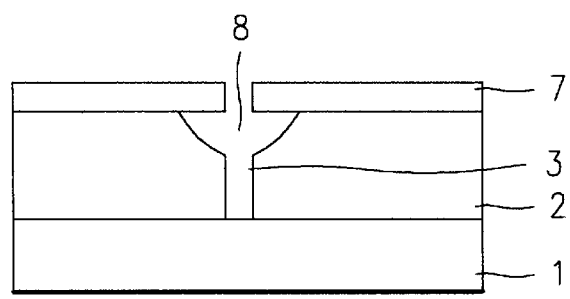

FIGS. 3a to 3f are cross-sectional views showing a fabrication process of a capacitor for a semiconductor device in accordance with a second embodiment of the present invention. As shown in FIG. 3a, an interlevel insulating layer 2 is formed on a semiconductor substrate 1. As shown in FIG. 3b, the interlevel insulating layer 2 is then selectively etched through photolithography to form a recess region 8 and a contact hole 3, thus exposing a predetermined portion of the substrate 1. More specifically, an isotropic etch (such as a wet etch or a chemical dry etch) is carried out using a predetermined resist pattern 7 to form an under-cut beneath the resist pattern 7. After the formation of the recess region 8 by the under-cut, the interlevel insulating layer 2 is then etched by using an anisotropic etching such as RIE to expose the substrate 1, thereby forming the contact hole 3. Accordingly, the contact hole 3 and the recess region 8 are formed by using the photolithography process only once.

Figure 3C:
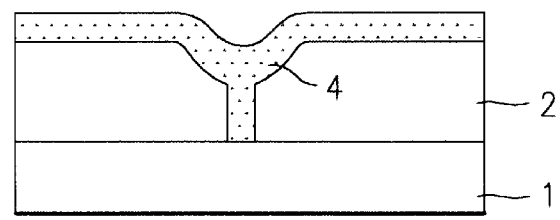
Figure 3D:
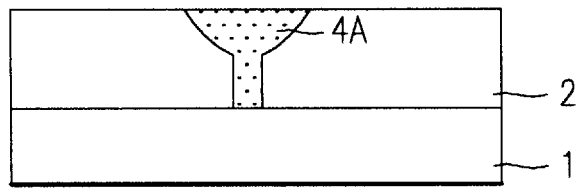

As shown in FIG. 3c, after removing the resist pattern 7, a material 4 for forming a lower electrode is deposited on the interlevel insulating layer 2, including the recess region 8 and the contact hole 3. Then, as shown in FIG. 3d, the material 4 is etched back to expose the interlevel insulating layer 2, thus forming a lower electrode 4A in the contact hole 3 and the recess region 8.

Figure 3E:
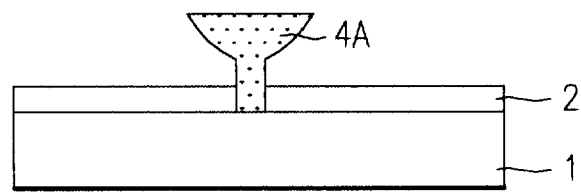
Figure 3F:
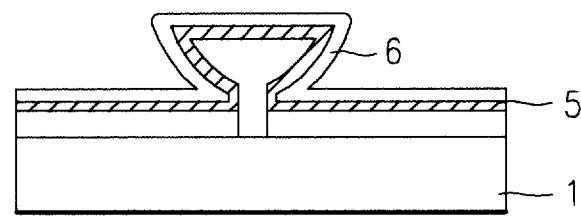

As shown in FIG. 3e, the interlevel insulating layer 2 is then etched without using a resist to expose the entire portion of the lower electrode 4A in the recess region 8 and a portion of the lower electrode 4A in the contact hole 3. Then, as shown in FIG. 3f, a dielectric thin film 5 is formed on the overall surface of the lower electrode 4A and the interlevel insulating layer 2, and an upper electrode 6 is formed on the dielectric thin film 5. The capacitor thus formed has a large capacitance because the upper electrode 6 has a large surface area including the bottom portion, the top portion and the side portion.

Figure 4A:
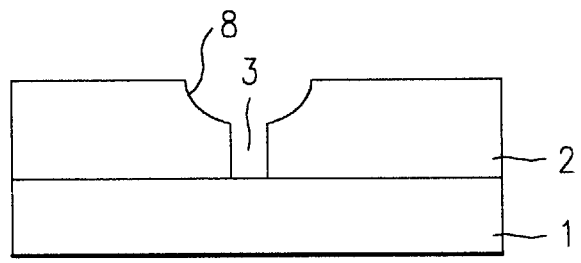
FIGS. 4a to 4f are cross-sectional views showing a fabrication process of a capacitor for a semiconductor device in accordance with a third embodiment of the present invention.

FIGS. 4a to 4f are cross-sectional views showing a fabrication process of a capacitor for a semiconductor device in accordance with a third embodiment of the present invention. As shown in FIG. 4a, an interlevel insulating layer 2 is formed on a semiconductor substrate 1. The interlevel insulating layer 2 is then selectively etched through photolithography (e.g., wet and dry etching) to form a recess region 8 and a contact hole 3, thus exposing a predetermined portion of the substrate 1.

Figure 4B:
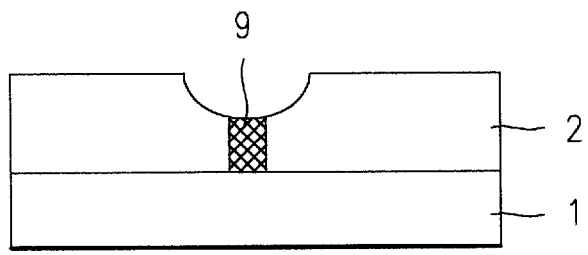

As shown in FIG. 4b, a polysilicon layer 9 is deposited on the interlevel insulating layer 2, including the recess region 8 and the contact hole 3. The polysilicon layer 9 is then etched back so that the polysilicon layer 9 remains in the contact hole 3. The polysilicon layer 9 is formed of phosphorous-doped polysilicon having excellent deposition characteristics and it does not react with the semiconductor substrate 1.

Figure 4C:
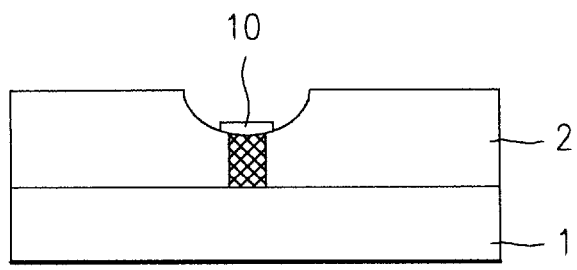

As shown in FIG. 4c, Ti is deposited on the polysilicon layer 9 and the interlevel insulating layer 2 to a thickness of about 200 Å using sputtering. A heat treatment is carried out at a temperature of about 800° C. for about one minute, in the ambient of an inert gas (such as Ar) through a rapid thermal processing (RTP), to thereby selectively form Ti-silicide only on the polysilicon layer 9 located at the contact hole 3. After the formation of Ti-silicide, the remaining Ti, which did not react with the polysilicon layer 9, is removed by wet etching, and RTP is performed at a temperature of about 800° C. for about one minute in a nitric ambient, such as $N_2$ and $NH_3$. By doing so, Ti-silicide is nitrified to form a TiN diffusion stop layer 10 on the polysilicon layer 9.

Figure 4D:
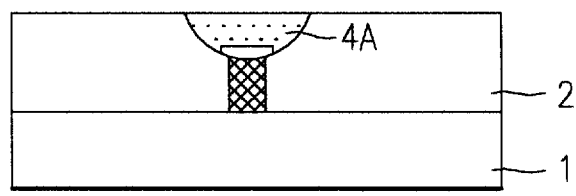

As shown in FIG. 4d, a material for forming a lower electrode 4A is deposited by sputtering on the overall surface of the interlevel insulating layer 2 and the diffusion stop layer 10. The material is then etched back so that it remains only in the recess region 8, thereby forming the lower electrode 4A. Here, the lower electrode 4A may be formed of Pt, Ir, Ru, $IrO_2$, $RuO_2$, $SrRuO_3$, $YBa_2Cu_3O_7$, or $(La,Sr)CoO_3$. These materials for the lower electrode 4A do not react with a dielectric layer formed of $(Ba,Sr)TiO_3$ or $Pb(Zr,Ti)O_3$.

Figure 4E:
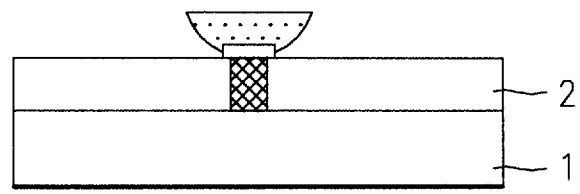
Figure 4F:
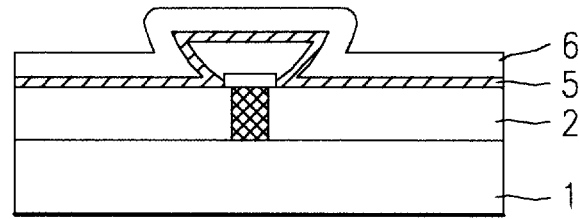

As shown in FIG. 4e, the interlevel insulating layer 2 is etched without using a resist, to expose the lower electrode 4A located in the recess region 8. Then, as shown in FIG. 4f, a dielectric thin film 5 is formed on the overall surface of the lower electrode 4A and the interlevel insulating layer 2, and an upper electrode 6 is formed on the dielectric thin film 5.

Thus, in the third embodiment of the present invention, the lower electrode of the capacitor is formed of a material which does not react with the dielectric film formed of a material having a high dielectric constant. In addition, the polysilicon layer formed in the contact hole is capable of good step coverage and does not react with the semiconductor substrate.

Figure 5A:
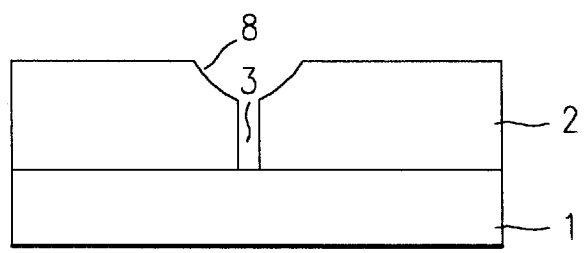
FIGS. 5a to 5f are cross-sectional views showing a fabrication process of a capacitor for a semiconductor device in accordance with a fourth embodiment of the present invention.

FIGS. 5a to 5f are cross-sectional views showing a fabrication process of a capacitor for a semiconductor device in accordance with a fourth embodiment of the present invention. As shown in FIG. 5a, an interlevel insulating layer 2 is formed on a substrate 1, and the interlevel insulating layer 2 is then selectively etched by using photolithography including isotropic and anisotropic etching) to form a recess region 8 and a contact hole 3, thus exposing a predetermined portion of the substrate 1.

Figure 5B:
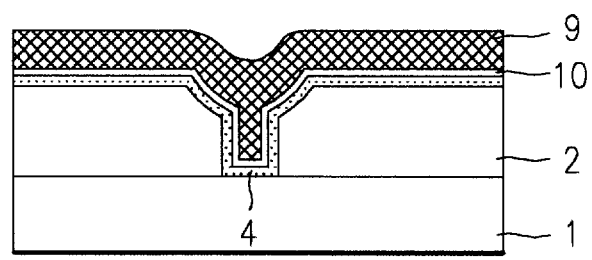

As shown in FIG. 5b, a first metal layer 4, a first diffusion stop layer 10, and a polysilicon layer 9, are sequentially formed on the interlevel insulating layer 2 including the recess region 8 and the contact hole 3. Here, the first metal layer 4 is formed of a material, such as Pt, Ir, Ru, $IrO_2$, $RuO_2$, $SrRuO_3$, $YBa_2Cu_3O_7$, or $(La,Sr)CoO_3$, that does not react with a material for a dielectric layer. The first diffusion stop layer 10 is formed of a material made mainly of titanium and nitrogen (e.g., a nitride metal consists essentially of titanium and nitrogen), and the polysilicon layer 9 is formed of phosphorus-doped polysilicon through an LPCVD process.

Figure 5C:
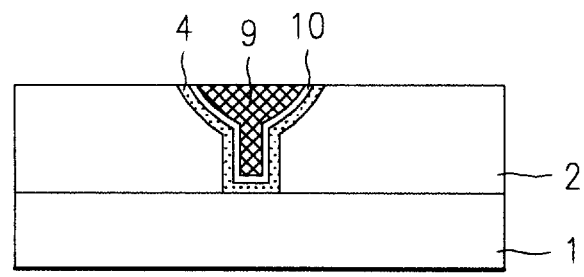
Figure 5D:
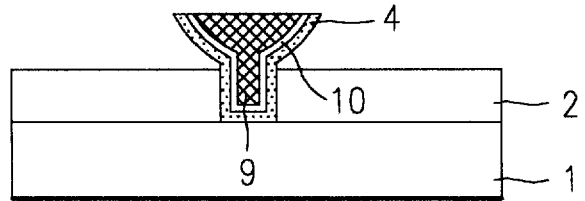

As shown in FIG. 5c, the polysilicon layer 9, the first diffusion stop layer 10, and the first metal layer 4 are etched back to expose the surface of the interlevel insulating layer 2. Then, as shown in FIG. 5d, the interlevel insulating layer 2 is etched without using a resist to expose the entire portion of the first metal layer 4 in the recess region 8 and a portion of the first metal layer 4 in the contact hole 3.

Figure 5E:
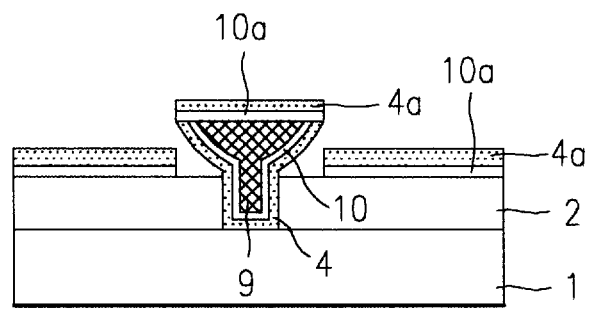
Figure 5F:
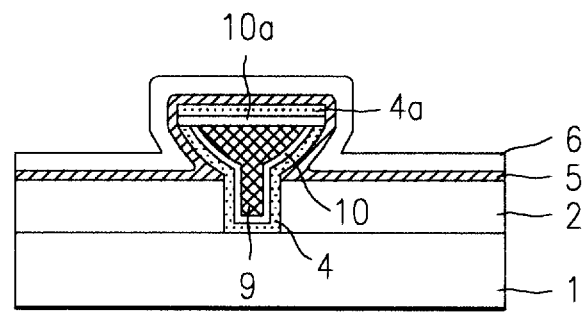

As shown in FIG. 5e, a material 10a for a second diffusion stop layer and a material 4a for a second metal layer are sequentially deposited on the overall surface of the substrate through a line-of-sight deposition method such as sputtering, thereby discontinuously forming the second diffusion stop layer 10a and the second metal layer 4a on the polysilicon layer 9 and the interlevel insulating layer 2. As shown in FIG. 5f, the second diffusion stop layer 10a and the second metal layer 4a formed on the interlevel insulating layer 2 are removed, thus forming a lower electrode in which the diffusion stop layers 10a and 10 and the metal layers 4a and 4 cover the polysilicon layer 9. Then, a dielectric thin film 5 and an upper electrode 6 are sequentially formed on the overall surface of the lower electrode and the interlevel insulating layer 2.

Thus, in the fourth embodiment of the present invention, a material (4a and 4) having a low reaction rate with the dielectric thin film 5 is used only on the surface of the lower electrode.

As described above, the method for fabricating capacitors for semiconductor devices according to the present invention has the following advantages.

First, the conventional method cannot use a material such as Pt as an electrode for a capacitor (especially for a capacitor having a dielectric layer with a high dielectric constant), since Pt is difficult to etch. In contrast, the present invention forms the lower electrode of the capacitor by utilizing the contact hole formed in the insulating layer (which is easy to process). In other words, the lower electrode is not etched by using photolithography. Therefore, even a precious metal difficult to etch, such as Pt, can be easily used as the lower electrode in the present invention.

Second, in the present invention, the contact hole is formed through a photolithography process, and the electrode of the capacitor is formed by utilizing the contact hole without any additional photolithography processes. Accordingly, the present invention reduces the number of required photolithography processes, thus simplifying the fabrication process.

Third, since the electrode of the present invention has several portions that can be used for the capacitor (e.g., a lower portion, an upper portion, and a side portion), this increases the effective area of the capacitor, thus increasing the capacitance.

It will be apparent to those skilled in the art that various modifications and variations can he made in the capacitor fabricating method of the present invention without departing from the spirit or scope of the invention. Thus, it is intended that the present invention cover the modifications and variations of this invention provided they come within the scope of the appended claims and their equivalents.

What is claimed is:

1. A method for fabricating a capacitor comprising the steps of:

depositing an insulating layer on a substrate;

selectively removing the insulating layer and forming a contact hole having a V-shape;

forming a first electrode in the contact hole;

removing the insulating layer to expose a portion of the first electrode; and sequentially forming a dielectric layer and a second electrode on the exposed portion of the first electrode.

2. The method as claimed in claim 1, wherein the step of selectively removing the insulating layer includes the step of anisotropically etching the insulating layer to form the contact hole having a V-shape.

3. The method as claimed in claim 2, wherein the anisotropic etching is performed through a reactive ion etching process.

4. A method for fabricating a capacitor comprising the steps of:

depositing an insulating layer on a substrate;

selectively removing the insulating layer and forming a contact hole including a recess region, the contact hole including the recess region having a first depth;

forming a first electrode in the contact hole including the recess region, the first electrode having the first depth;

removing the insulating layer to expose a portion of the first electrode so that the insulating layer has a second depth, the second depth being less than the first depth; and sequentially forming a dielectric layer and a second electrode on the exposed portion of the first electrode.

5. The method as claimed in claim 4, wherein the step of forming the contact hole including the recess region includes the steps of:

forming a photoresist pattern on the insulating layer; and etching the insulating layer isotropically to form the recess region and etching the insulating layer anisotropically to form the contact hole by using the photoresist pattern as a mask.

6. A method for fabricating a capacitor comprising the steps of:

depositing an insulating layer on a substrate;

selectively removing the insulating layer and forming a contact hole with a first depth;

forming a first electrode with the first depth by sequentially forming a conductive semiconductor layer, a diffusion stop layer, and a metal layer in the contact hole;

removing the insulating layer to expose the metal layer of the first electrode so that the insulating layer has a second depth, the second depth being less than the first depth; and sequentially forming a dielectric layer and a second electrode on the exposed metal layer.

7. The method as claimed in claim 6, wherein the step of selectively removing the insulating layer includes wet etching and dry etching to form a recess region in a portion of the contact hole.

8. The method as claimed in claim 6, wherein the contact hole has a recess region and the metal layer is formed in the recess region.

9. The method as claimed in claim 6, wherein the conductive semiconductor layer includes phosphorus-doped polysilicon.

10. The method as claimed in claim 6, wherein the diffusion stop layer includes a nitride metal including titanium and nitrogen.

11. The method as claimed in claim 6, wherein the step of forming the diffusion stop layer includes the steps of:

depositing Ti on the conductive semiconductor layer through sputtering;

performing a heat treatment to form Ti-silicide on the conductive semiconductor layer; and performing a rapid thermal processing in a nitric ambient to form the diffusion stop layer.

12. The method as claimed in claim 6, wherein the metal layer includes one of Pt, Ir, Ru, $IrO_2$, $RuO_2$, $SrRuO_3$, $YBa_2Cu_3O_7$, and $(La,Sr)CoO_3$.

13. A method for fabricating a capacitor comprising the steps of:

depositing an insulating layer on a substrate;

selectively removing the insulating layer and forming a contact hole with a first depth;

sequentially forming a first metal layer, a first diffusion stop layer, and a conductive semiconductor layer on the insulating layer and the contact hole;

etching the conductive semiconductor layer, the first diffusion stop layer, and the first metal layer to expose the insulating layer and forming a first electrode with the first depth;

removing the insulating layer so that the insulating layer has a second depth which is less than the first depth;

sequentially forming a second diffusion stop layer and a second metal layer on the first electrode; and forming a dielectric layer and a second electrode on the first metal layer and the second metal layer.

14. The method as claimed in claim 13, wherein the step of selectively removing the insulating layer includes isotropic etching and anisotropic etching to form the contract hole having a recess region at an upper portion.

15. The method as claimed in claim 13, wherein the first metal layer and the second metal layer each includes one of Pt, Ir, Ru, $IrO_2$, $RuO_2$, $SrRuO_3$, $YBa_2Cu_3O_7$, and $(La,Sr)CoO_3$.

16. The method as claimed in claim 13, wherein the first diffusion stop layer and the second diffusion stop layer each includes a nitride metal including titanium and nitrogen.

17. The method as claimed in claim 13, wherein the conductive semiconductor layer includes phosphorus-doped polysilicon.

18. The method as claimed in claim 13, wherein the step of forming the conductive semiconductor layer includes performing a low pressure chemical vapor deposition process.

19. The method as claimed in claim 13, wherein the steps of forming the second diffusion stop layer and the second metal layer include sputtering.

* * * * *

UNITED STATES PATENT AND TRADEMARK OFFICE
CERTIFICATE OF CORRECTION

PATENT NO. : 5,849,618
DATED : December 15, 1998
INVENTOR(S) : Yoo-Chan JEON

It is certified that error appears in the above-identified patent and that said Letters Patent is hereby corrected as shown below:

Column 8, line 38  change "laver" to --layer--.

Signed and Sealed this

Eighteenth Day of May, 1999

Attest:

Attesting Officer

Q. TODD DICKINSON

Acting Commissioner of Patents and Trademarks